United States Patent [19]

Baker

[11] 4,158,866
[45] Jun. 19, 1979

[54] PROTECTION CIRCUIT FOR TRANSISTORIZED SWITCH

[75] Inventor: Richard H. Baker, Bedford, Mass.

[73] Assignee: Exxon Research & Engineering Co., Florham Park, N.J.

[21] Appl. No.: 855,994

[22] Filed: Nov. 30, 1977

[51] Int. Cl.² ............................................. H02H 3/26
[52] U.S. Cl. ...................................... 361/86; 361/88; 361/89; 361/92
[58] Field of Search ...................... 361/88, 89, 86, 94, 361/98, 92, 100, 101

[56] References Cited

U.S. PATENT DOCUMENTS

| | | | |
|---|---|---|---|
| 3,408,589 | 10/1968 | Nishioka | 330/51 |
| 3,449,598 | 6/1969 | Wright | 361/98 X |
| 3,534,249 | 10/1970 | Neill et al. | 361/98 X |
| 3,854,089 | 12/1974 | Emler | 324/96 |
| 3,914,667 | 10/1975 | Waldron | 361/94 |

FOREIGN PATENT DOCUMENTS 1946874 3/1971 Fed. Rep. of Germany ........... 361/101

*Primary Examiner*—Harry E. Moose, Jr.
*Attorney, Agent, or Firm*—Kenneth Watov

[57] ABSTRACT

The collector-emitter voltages ($V_{ce}$) of each one of the two transistors of a single-pole-double-throw transistorized switch are independently sensed by a sensing circuit for producing a fault signal, whenever the $V_{ce}$ of each transistor concurrently approaches or exceeds the magnitudes of first and second DC reference voltages, respectively, by predetermined differentials. Control logic is responsive to the fault signal for removing the base drive from the conducting one of the transistors. An RC network is included in the sensing circuit, for delaying the production of the fault signal, both to avoid false triggering of the control logic, and to provide time for sequentially turning off one transistor and turning on the other transistor.

28 Claims, 4 Drawing Figures

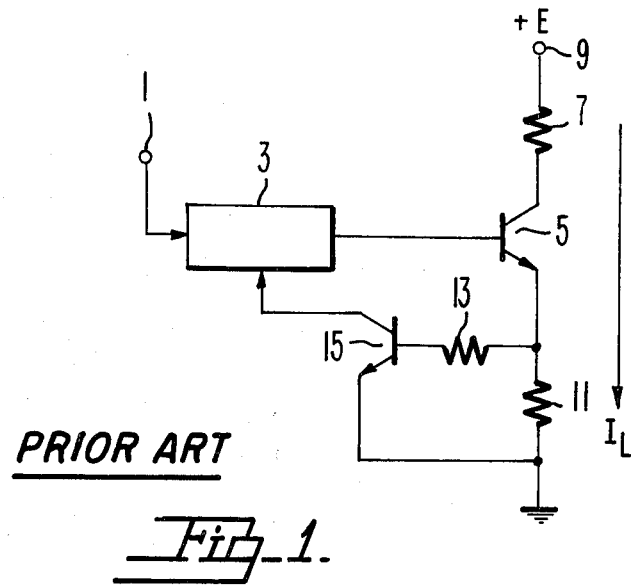
PRIOR ART
*Fig_1.*
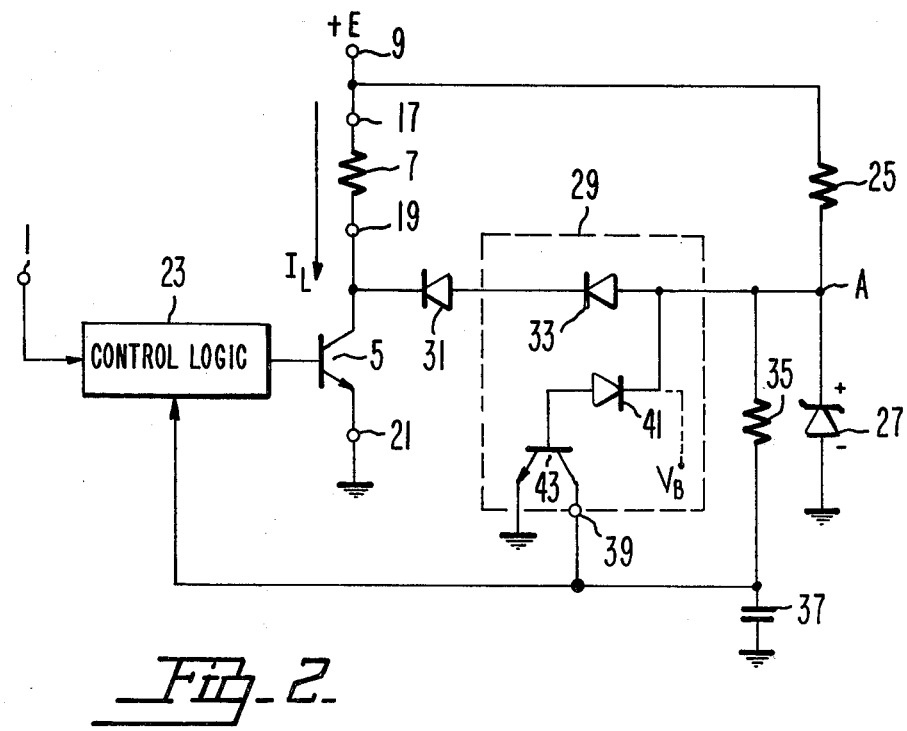
*Fig_2.*

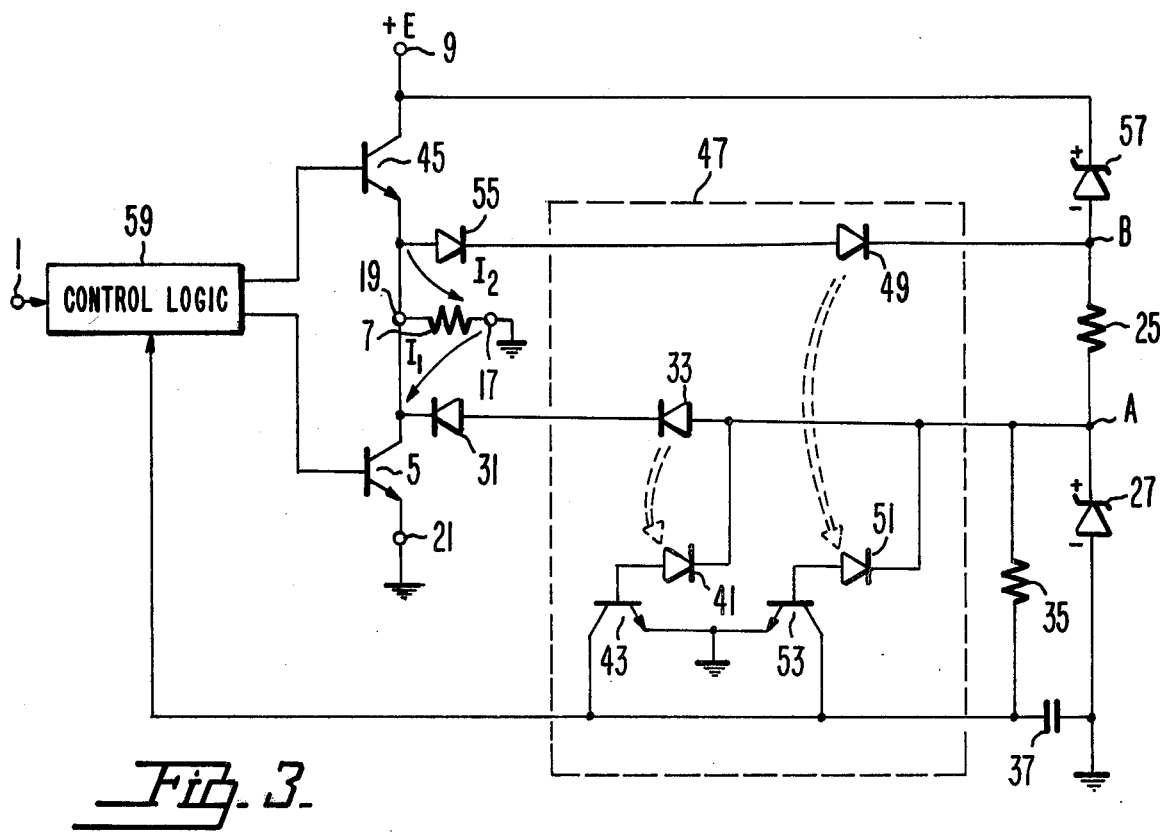
_Fig. 3._
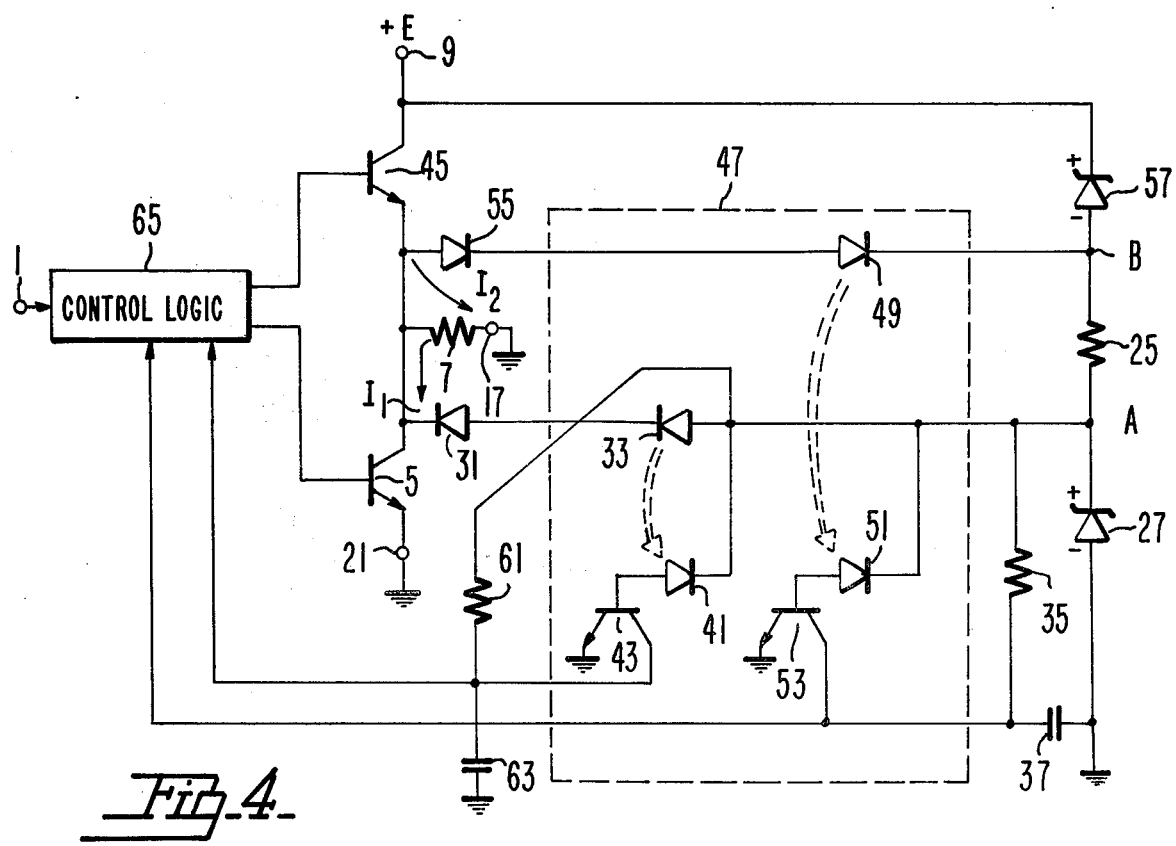
_Fig. 4._

PROTECTION CIRCUIT FOR TRANSISTORIZED SWITCH

The field of the present invention relates generally to protection circuits for transistors, and more particularly to protection circuits for switching transistors.

In solid-state switching circuits, one or more power transistors are often used as load switches. For reliable operation of the switching circuit, the output transistors must be protected from excessive power dissipation during fault conditions, such as a shorted load causing higher-than-rated current to flow through the main current paths of the output transistors. In high-power switching circuits, it is important tha the protection circuit itself not dissipate large amounts of power, be insensitive to relatively short-lived transients, and be insensitive to normal operation of a circuit causing sequential turning on and turning off of various transistors in the output stage of the circuit.

The present invention senses the voltage between the collector and emitter electrodes of a conducting output transistor, and when this voltage rises to greater than a predetermined value, for greater than a predetermined period of time, the protection circuit responds by removing the base drive from the transistor.

In the drawings, where like items are indicated by the same reference designation:

FIG. 1 is a circuit schematic diagram of a prior art circuit for protecting a transistor;

FIG. 2 is a circuit schematic diagram of one embodiment of the present invention;

FIG. 3 is a circuit schematic diagram of a second embodiment of the present invention; and FIG. 4 is a circuit schematic diagram of a third embodiment of the present invention.

A transistorized switching circuit is shown in FIG. 1. When a control signal is applied to control terminal 1, the control logic 3 responds by applying a turnon signal to the base electrode of the switching transistor 5. The switching transistor 5 turns on, substantially lowering the impedance between its collector and emitter electrodes, for conducting current $I_L$ through a load resistor 7 connected between the collector electrode of the transistor 5 and an operating voltage terminal 9. The operating voltage terminal 9 is adapted for receiving an operating voltage +E. A sensing resistor 11 is provided in the emitter circuit of the transistor 5 for sensing the magnitude of the current $I_L$. Whenever the magnitude of the load current $I_L$ increases in magnitude to above a predetermined value, the voltage drop across the resistor 11 is applied via input resistor 13 across the base-emitter junction of the protection transistor 15, for turning on this transistor 15. When transistor 15 so turns on, a source of reference potential, ground in this example, is applied to the control logic 3, for operating the logic 3 removing the turnon signal or base drive from the base electrode of the output transistor 5, turning off transistor 5. This method of protecting a transistor is known as "current sensing". Such a current sensing protection circuit is usable for low currents having magnitudes up to about 50 amperes, but above 50 amperes excessive power dissipation occurs in the sensing resistor 11. Such excessive dissipation occurs because the voltage drop across sensing resistor 11 must be about 1 volt, for turning on the protection transistor 15. Accordingly, if the protection transistor 15 is to be turned on when the load current attains a magnitude of about 50 amps, then almost 50 watts of power will be dissipated in the sensing resistor 11 at the time of turnon of transistor 15. The resistance of the sensing resistor 11 can be reduced to limit the power dissipation of this resistor, but this means that the protection circuit transistor 15 must be turned on at correspondingly lower values of voltage across resistor 11, which unfortunately causes noise problems. In such high-power switching circuits, operating above 50 amperes, the rate of rise of the load current (dI/dT) becomes so large during turnon of output transistor 5 that the residual series inductances within the circuit cause large voltage spikes, which must be filtered. Such filtering slows down the response of the switching circuit, decreases the turnoff time of the switching circuit and consequently can allow the "protected transistor" to burn out because of the inability of the protection circuit to respond in time.

The present invention substantially eliminates the problem of power dissipation of the protection circuit in high-power switching circuits, and the inherent noise problems encountered in using current-sensing techniques, by employing voltage sensing of the collector-emitter $V_{ce}$ of the power transistor being protected. In FIG. 2, a first embodiment of the invention includes the output transistor 5, output terminals 17 and 19, for connection to a load 7, a first terminal 9 for receiving an operating voltage +E, a second terminal 21 connected to a source of reference potential, ground in this example, a control logic network 23 for applying a high or digital 1 signal to the base of transistor 5 for turning this transistor on, or a low-level or digital zero signal to the base electrode for turning transistor 5 off. A positive polarity DC reference voltage is produced at point A by the combination of resistor 25 and zener diode 27. This reference voltage is made lower in value than the operating DC voltage +E applied to terminal 9. The zener diode 27 could be replaced by a resistor, but it is preferred that a zener diode 27 be used to insure the regulation of the value of the DC reference voltage even with fluctuations in the value of the operating voltage +E. An optical coupler 29 is connected in series circuit with a blocking diode 31 (the blocking diode protects the light-emitting diode 33 from burnout due to excessive values of reverse bias voltage) between the collector electrode of transistor 5 and point A, as shown. An RC timing circuit 35,37 is connected between point A and ground, with the common connection of the resistor 35 and capacitor 37 being connected to the output terminal 39 of the optical coupler 29.

In operation of the circuit of FIG. 2, a turnon signal is applied to input terminal 1, for operating the control logic network 23 to apply a high-level signal to the base electrode of NPN transistor 5, turning on this transistor. When transistor 5 so turns on, the $V_{ce}$ of transistor 5 is reduced from +E to a relatively low value of voltage, and current $I_L$ flows through the load 7 and collector-emitter path of transistor 5 to ground. Assume that transistor 5 is now in its saturated conduction state. The DC reference voltage at point A, in this case the zener diode 27 voltage rating, is made to have a level of voltage greater than the sum of the forward-conducting voltage drops of the light-emitting diode (LED) 33, the blocking diode 31, and the saturation $V_{ce}$ of transistor 5. Accordingly, with transistor 5 in saturation, current will flow from point A, through the LED 33 and blocking diode 31 into the collector electrode of transistor 5, causing the LED 33 to emit light. Resistor 25 provides a current source, and voltage $V_a$ at A is equal to the zener voltage of 27, as mentioned. Accordingly, when the sum of $V_{ce}$ of transistor 5 and forward voltage drops of diodes 31 and 33 is less than the zener voltage of 27, then the magnitude of the current flowing through these diodes 31,33 is substantially independent of the difference in the levels of $V_{ce}$ of transistor 5 and $V_a$. The light is detected by light-sensitive diode or photodiode 41, which responds by reducing its impedance, permitting base current to flow from point A into the base of transistor 43, turning on this transistor. It should be noted that the cathode of photodiode 41 does not have to be connected to point A, but can be alternatively connected for receiving some independent source of operating voltage $V_b$, as shown in phantom. When transistor 43 so turns on, its collector 34 is near ground and is indicative of normal operation of the switching transistor 5, and the control logic is programmed to continue to apply a high-level signal to the base electrode of transistor 5, so long as a turnoff signal is not applied to the input terminal 1 of the control logic 23. If a fault condition occurs, such as the load 7 being shorted, causing higher-than-rated load current $I_L$ to flow through transistor 5, transistor 5 will come out of saturation, causing a rise in the level of the voltage between its collector-emitter electrodes $V_{ce}$. When the $V_{ce}$ rises to a level where the sum of the $V_{ce}$ plus the forward voltage drops across diode 31 and LED 33 are greater than the level of the DC reference voltage at point A, current will no longer flow through the LED 33. LED 33 stops emitting light, as a result of the lack of current flow therethrough, and photodiode 41 responds by raising the value of its impedance, thereby preventing the flow of current into the base electrode of transistor 43, which turns off. When transistor 43 turns off, the voltage at output terminal 39 (considered a fault terminal) is raised from ground to the level of the DC reference voltage at point A. In the absence of capacitor 37, the high-level fault signal so developed at output terminal 39 occurs substantially immediately after transistor 43 turns off, and is applied to the control logic 23, which responds by removing the base drive to transistor 5 (grounding or applying a low-level signal to the base electrode), causing transistor 5 to turn off, regardless of the level of the signal applied to input terminal 1. In certain applications, it is desirable to delay the application of the fault signal or high-level signal at output terminal 39 to the control logic for a predetermined duration of period of time, in order to avoid false triggering of the control logic 23 due to short-lived transient conditions that may occur in the normal operation of the switching circuit. Such a time delay can be readily provided by the inclusion of capacitor 37 as shown. With capacitor 37 in the circuit, when transistor 43 turns off, the voltage at output terminal 39 will rise exponentially from ground towards the level of the DC reference voltage at point A, with a time constant equal to the product of the values of resistor 35 and capacitor 37. This time constant is set at a value for causing the voltage to rise from ground to a triggering level for the control logic in the predetermined time duration required for preventing false triggering due to the transient conditions, but within the period of time required to turn off transistor 5 before damage has occurred. It should be noted that the optical coupler 29 is itself operating as a current sensor, but in combination with the other elements of the protection circuit, is responding directly to the $V_{ce}$ of transistor 5. Other current-sensing circuits can be substituted for the optical coupler 29, but in general do not provide its advantages of noise immunity and low cost.

In FIG. 3, a second NPN switching transistor 45 has been added to the circuit of FIG. 2, which also has been modified to include a second embodiment of the invention. The second embodiment of the invention includes a dual optical coupler 47 (which how has in addition to the components of the optical coupler 29 of FIG. 2, a second LED 49, a second photo diode 51, and a second switching transistor 53), a second blocking diode 55, a second zener diode 57, and a modified control logic 59. The circuit of FIG. 3 provides for alternate conduction of transistors 5 and 45, thereby connecting the output terminal 19 to ground or +E volts, respectively. Accordingly, a transistorized single-pole-double-throw switching action is provided by the NPN transistors 5 and 45 as controlled by proper operation of the control logic 59, as will be described.

In operation of the circuit of FIG. 3, a digital 1 ("one") signal is applied to input terminal 1, to operate the control logic 59, which responds by concurrently applying a high-level signal to the base of NPN transistor 45, and a low-level signal to the base of NPN transistor 5. NPN transistor 45 is turned on into saturation for substantially applying the operating voltage +E to terminal 19, and for conducting the current $I_2$ through its collector-emitter main current path, into load 7, terminated to ground via output terminal 17, in this example. At this time NPN switching transistor 5 is cut off via the low-level signal at its base electrode. The voltage rating of the zener diode 57 is chosen, in this example, to be greater than the sum of the forwardbiased voltage drops of blocking diode 55, LED 49, and the voltage between the collector and emitter electrodes of transistor 45 in saturation $V_{ce(SAT.)}$. Accordingly, with transistor 45 in saturation, substantially +E is also applied to the anode of diode 55, forwardbiasing the series diode circuit of diode 55 and LED 49, causing current to flow through these diodes 55,49 to point B. With LED 49 conducting current, it emits light for illuminating photodiode 51. Photodiode 51 reduces its impedance in response to this light, for conducting current from point A into the base electrode of transistor 53, turning on transistor 53 for substantially applying ground to the control logic 59, and for discharging capacitor 37 to ground. This ground signal from the dual optical coupler 47 is indicative of normal operation of the switching circuit. If a fault condition occurs, such as the shorting of the load resistor 7, causing excessive current flow through the main current path of transistor 45, transistor 45 will come out of saturation. As a result, the $V_{ce}$ of transistor 45 increases in value, causing the voltage at the anode of diode 55 to decrease to below the reference voltage at point B, backbiasing the diode string of diode 55 and LED 49. Accordingly, LED 49 is no longer emitting light, and photodiode 51, in the absence of this light, increases its impedance to a relatively high value, preventing the flow of current from point A into the base electrode of transistor 53. Transistor 53 is turned off, causing the voltage at its collector electrode to rise exponentially in accordance with the time constant of the product of resistor 35 and capacitor 37, as previously explained. This voltage will rise towards the level of the DC reference voltage at point A, and is a fault signal for application to the control logic. When the level of the fault signal exceeds the switching threshold for the control logic, the control logic 59 responds by removing the high-level signal from the base of transistor 45, and applying a low level or ground signal to this base electrode, for turning off and preventing damage to transistor 45.

Assuming that transistor 45 has been turned on into saturation as previously explained, and that the circuit is operating normally, if a digital "0" signal is applied to the input terminal 1, the control logic 59 responds by first removing the high-level signal from the base electrode of transistor 45 and applying a low-level signal to this base electrode for turning off transistor 45. A short time thereafter the control logic changes the low-level signal at the base electrode of transistor 5 to a high-level signal for turning on transistor 5. When transistor 5 is so turned on into saturation, the impedance across its collector-emitter electrode is reduced to a relatively low value, for substantially applying ground to output terminal 19 and the cathode electrode of blocking diode 31. If the output terminal 17 is terminated to ground as shown, no current will flow through the load 7, but if in a certain application the output terminal 17 is returned to some positive level of voltage, for example, a current $I_1$ will flow through the load 7 into the collector of transistor 5. Also at this time, as previously explained in the operation of FIG. 2, current is flowing through the LED 33, for illuminating the photodiode 41 for turning on NPN transistor 43, causing a ground signal to be applied to the control logic 59, and the capacitor 37 to be discharged to ground via the main conduction path of transistor 43. As before, this ground signal in indicative of normal operation of the switching circuit. If a fault condition occurs causing excessive current to flow through the NPN power switching transistor 5, then as previously described, transistor 5 will come out of saturation causing a cessation of current flow through LED 33, a substantial increase in the impedance of photodiode 41, and the turning off of transistor 43, for producing a high-level fault signal to operate the control logic 59 for turning off transistor 5.

The RC timing network of resistor 35 and capacitor 37 serves a dual function in the switching circuit of FIG. 3. It provides for substantially eliminating a false trigger signal to the control logic 59 due to normal transients. Also the RC integrator network prevents faulting the control logic 59 when the control logic 59 is operating normally to sequentially turn off one of the transistors 5 and 45, and then turn on the other, as will be described. Assume that NPN power transistor 45 is in saturation, and NPN power transistor 5 is cut off. As previously described, for this condition transistor 53 is turned on, and 43 turned off, for applying a ground signal to the control logic 59, indicating normal operation of the switching circuit. If a digital "0" signal is now applied to the input terminal 1, the control logic 59 responds by first turning off transistor 4, and then turning on transistor 5. In making this switching transition, the control logic 59 is designed to prevent simultaneous conduction of the transistors 5 and 45. Accordingly, in switching the conduction states of these transistors, there is designed into the controller 59 a short period of time when the controller holds both transistors in a nonconductive state. When nonconductive, the impedance between the collector and emitter electrodes of transistors 5 and 45 is relatively high, preventing the flow of current through either of the LED's 33,49. Accordingly, if one assumes that capacitor 37 is not in the circuit, a dual optical coupler 47 will generate a fault signal, causing the control logic 59 to apply low-level signals to each one of the base electrodes of the transistors 5 and 45, latching the circuit into an inoperative state. Capacitor 37 is included in the circuit to prevent such latchup, by providing in combination with resistor 35, a predetermined duration of time for the fault signal to attain the switching threshold level of the control logic 59. The time constant (equal to the product of the values of resistor 35 and capacitor 37) is chosen to be long enough to enable the switching logic 59 to complete the turnoff of one of the transistors 5 and 45, and turnon of the other of these transistors. Once the control logic has completed the switching sequence, one of the transistors, 5 or 45, will be in saturation and the other in non-conductivity, causing the dual optical coupler 47 to be operative as previously described for applying a ground signal to the control logic indicative of normal operation. When a fault condition occurs in the circuit, the RC circuit 35,37 in effect measures the duration of this fault condition, and if the condition persists for greater than the predetermined duration of time, the fault signal triggers the control logic 59 into the fault condition.

In some applications resistors can be substituted for the zener diodes 27 and 57, for example, for generating the DC reference voltages at points A and B. Zener diodes 27,57 are used to substantially prevent variations in the reference voltages at points A and B, in those applications where large fluctuations in the value of the operating voltage $+E$ may occur. The DC reference voltage supply of current source resistor 25, and the zener diodes 27,57 can also be eliminated entirely by obtaining the DC reference voltages from batteries, or from other DC voltage supplies, for example. Also, the conductivities of the power transistors 5 and 45 are shown as NPN, in this example. One skilled in the art could just as readily apply the principles of the various embodiments of this invention for use with PNP or mixed conductivity transistors. Also note that the blocking diodes 31 and 55 are required for preventing damage to the LED's 33 and 49, respectively, due to excessive backbias voltage. In low voltage applications, the blocking diodes 31 and 55 can be eliminated.

In FIG. 4 a third embodiment of the invention is shown. In this embodiment the connections in the dual optical coupler 47 have been modified as shown, and a new control logic 65 is employed, which operates similarly to control logic 59 except that the control logic 65 is responsive to either one of first and second fault signals generated by the turnoff of transistors 43 and 53, respectively. The timing circuit of resistor 35 and capacitor 37 provides a predetermined time delay in the generation of the second fault signal, whereas the combination of resistor 61 and capacitor 63 have been added for providing a predetermined time duration for generating the first fault signal. The operation of the circuit of FIG. 4 is essentially identical to the operation of the circuit of FIG. 3, with a few variations. In FIG. 4 the control logic is operated to a fault condition when the first and second fault signals generated at capacitors 63 and 37, respectively, are concurrently at levels above the switching threshold levels of the control logic. Without the concurrent application of the two fault signals, the control logic 65 will maintain the switching circuit of FIG. 4 in a normal operating condition. When transistor 43 is turned off, the reference voltage at point A is applied by resistor 61 to the collector electrode of transistor 43, capacitor 63, and to the control logic in an exponential manner as capacitor 63 charges immediately after the turnoff of transistor 43. When transistor 43 is turned on, it provides via its collector-emitter current path a discharge path for capacitor 63. Similarly, when transistor 53 is initially turned off, capacitor 37 charges toward the reference voltage at point A via resistor 35, and its exponentially rising voltage is applied to the control logic 65. When transistor 53 is turned on, capacitor 37 discharges through the collector-emitter current path of transistor 53.

It is assumed in the description of operation of the three embodiments of the invention, that the control logic networks 23,59 and 65 are some combination of digital logic for providing the control functions described. In each embodiment of this invention, it is assumed that the various control logic networks 23,59,65 are designed to at the time of application of an input signal to input terminal 1, ignore the presence of a fault signal or fault signals below a threshold value and turn on the appropriate one of the switching transitors. If after turning on the particular one of the associated switching transistors, the fault signal or fault signals persist for greater than a predetermined period of time, the fault signal increases to a value above the logic threshold and the control logic then responds to the fault signal(s) and places the switching circuit in a fault condition, as previously described for FIGS. 2, 3 and 4.

In each of the three embodiments of the invention it is important to note that the protection circuits are sensing the $V_{ce}$ of the power transistor(s) being protected. The advantages of this method of voltage sensing over the prior art current sensing are several; the power dissipation in the voltage sensing circuits is greatly reduced, in comparison to current-sensing protection circuits, which is particularly important when switching high magnitudes of current. The voltage sensing protection system is less susceptible to noise than the current-sensing system, because the $V_{ce}$ of the transistors being protected is not sensitive to transient signals caused by rapidly changing current levels in stray inductances in the circuit. The voltage-sensing protection system also monitors the performance of the transistor being protected (degradation of transistor gain), as well as fault-induced load currents. Lastly, the present inventor's voltage-sensing systems are generally more economical than prior current-sensing systems.

What is claimed is:

1. A switching amplifier circuit comprising:
  a first terminal for receiving a first DC operating voltage, and for connection to one end of a load;
  a second terminal for receiving a source of reference potential;
  switching transistor means having a control electrode, for receiving a control signal, a first electrode for connection to the other end of said load, and a second electrode connected to said second terminal, said switching transistor means being responsive to the presence of a control signal for substantially lowering the impedance between its first and second electrodes, thereby providing a current conduction path therebetween;
  fault signal producing means connected to said first electrode and receptive of a second DC operating voltage greater in value than the saturation voltage of said switching transistor means, responsive directly to the level of voltage between said first and second electrodes approaching to within a predetermined differential of said second operating voltage, for at least a predetermined duration of time, for producing a fault signal;
  control means both responsive to a turnon signal, for producing and applying said control signal to said control electrode of said switching transistor means, for placing the latter into a conductive state, and thereafter responsive to said fault signal, for removing said control signal from said control terminal, to turn off said switching means.

2. The switching amplifier circuit of claim 1, wherein said fault signal producing means includes:
  current sensing means having one terminal connected to said first electrode, and another terminal receptive of said second DC operating voltage, for providing an output signal having an amplitude proportional to the magnitude of current flowing through said current-sensing means, the magnitude of current being substantially independent of the difference in the levels of voltage between said second DC operating voltage and the voltage between said first and second electrodes in the voltage range where the latter voltage has a level less than the former, outside of which range the magnitude of current is zero; and
  means coupled to said current sensing means, and responsive to the amplitude of said output signal of said current sensing means reducing to a predetermined amplitude corresponding to the voltage between said first and second electrodes exceeding a predetermined value, for said predetermined duration of time, for producing said fault signal.

3. The switching amplifier circuit of claim 2, wherein said switching transistor means includes an NPN switching transistor having a collector electrode as said first electrode, an emitter electrode as said second electrode, and a base electrode as said control electrode, and wherein said current sensing means includes:
  light-emitting diode means having an anode electrode receptive of said second DC operating voltage, and a cathode electrode; and
  a blocking diode having an anode electrode connected to the cathode electrode of said light-emitting diode means, and a cathode electrode connected to the collector electrode of said NPN switching transistor, said light-emitting diode means emitting a light beam as said output signal having an intensity proportional to the magnitude of current flowing through it.

4. The switching amplifier circuit of claim 3, wherein said means responsive to the amplitude of said output signal of said current-sensing means includes:
  an output terminal;
  a photodiode having a cathode electrode for receiving a third operating voltage, and an anode electrode, and located for receiving light produced by said light-emitting diode;
  a switching transistor having a base electrode connected to the anode electrode of said photodiode means, and a main current path connected between said second terminal and said output terminal;
  charge storage means connected between said output terminal and said second terminal; and
  a resistor connected between said output terminal and the cathode electrode of said photodiode, whereby whenever the magnitude of voltage between the collector and emitter electrodes of said NPN switching transistor is less than said second DC operating voltage, by at least the sum of the voltage drops of said blocking and light-emitting diodes when conducting current in a forwardbias condition, respectively, current flows through said light-emitting diode, which emits light, and said photodiode responds to the light from said light-emitting diode by, lowering its impedance for permitting current flow in the base electrode of said associated switching transistor, for turning on this transistor to substantially apply said reference potential to said output terminal, thereby indicating normal operation of said NPN switching transistor and load, and whenever the voltage between the collector and emitter electrodes of said NPN switching transistor has a level greater than that required for current flow through said light-emitting diode, substantially emits no light, said photodiode responds to the lack of light by raising its impedance to a relatively high value, thereby preventing base current flow in its associated switching transistor, causing this transistor to turn off, and said second DC operating voltage is as a result fully applied to said output terminal, after said predetermined duration of time set by the product of the impedances of said resistor and said charge storage means, indicating a fault or nonconductive condition of said NPN switching transistor.

5. The switching amplifier circuit of claim 4, wherein said charge storage means includes a capacitor.

6. The switching amplifier circuit of claim 1, wherein said fault signal producing means includes an optical coupler having a first sensing terminal connected to said first electrode, a second sensing terminal for receiving said second DC operating voltage, a reference terminal connected to said second terminal of said switching amplifier, and an output terminal for receiving said second DC operating voltage via resistive coupling; said optical coupler being connected for producing said reference potential at its output terminal whenever the difference in levels of voltage between said second DC operating voltage and the voltage between said first and second electrodes is positive and greater than a predetermined difference, and for producing said second DC operating voltage as said fault signal at its output terminal, whenever this difference in voltage levels is less than said predetermined difference.

7. A protection circuit for a switching amplifier including first and second output transistors, each having a base electrode for receiving first and second control signals, respectively, a collector electrode for receiving an operating voltage, and connection to an output terminal, respectively, and an emitter electrode connected to said output terminal, and for receiving a source of reference voltage, respectively, said first and second output transistors being individually turned on in response to a digital "one" level of their respective control signals, for substantially reducing the relative impedance between their respective collector and emitter electrodes, thereby providing a current conduction path therebetween and a substantially reduced relative voltage drop $V_{ce}$ thereacross, the $V_{ce}$ substantially increasing for a fault condition where either one has reduced current gain or insufficient base current drive so as to prevent saturation of, or excess current flow through, the respective conducting one of said first and second output transistors, or a transient voltage causing simultaneous conduction of said first and second output transistors, said first and second output transistors being turned off in response to a digital "zero" level of their respective control signals, said protection circuit comprising:

DC power supply means for providing at a first and a second power terminals thereof, first and second DC voltages, respectively;

first current sensing means connected between the emitter electrode of said first output transistor and said first power terminal, responsive to the magnitude of current flow therebetween reducing to below a predetermined value, as a result of the level of $V_{ce}$ of said first output transistor increasing toward or exceeding the level of said first DC voltage, for producing a first fault signal;

second current sensing means connected between the collector electrode of said second output transistor and said second power terminal, responsive to the magnitude of current flow therebetween reducing to below a predetermined value, as a result of the level of $V_{ce}$ of said second output transistor increasing toward or exceeding the level of said second DC voltage, for producing a second fault signal; and control logic means operable for selectively applying said first and second control signals having "zero" levels to the base electrodes of said first and second output transistors, for maintaining each transistor turned off, or for turning on only one of said first and second transistors at a time, via the appropriate combination of "one" and "zero" levels of said first and second control signals, said control logic means being responsive to the concurrence of said first and second fault signals, for turning off the conducting one of said first and second output transistors.

8. The protection circuit of claim 7, wherein said first current sensing means includes a first optical coupler having first and second input terminals connected to the emitter electrode of said first output transistor, and said first power terminal, respectively, a reference terminal for receiving said source of reference voltage, and an output terminal resistively connected to said second power terminal, said first optical coupler producing said reference voltage at its output terminal during normal conduction of said first output transistor, and producing said second DC voltage at its output terminal, as said first fault signal, for either nonconduction of or a fault condition in the conductive operation of said first output transistor.

9. The protection circuit of claim 8, wherein said second current sensing means incudes a second optical coupler having first and second input terminals connected to the collector electrode of said second output transistor, and said second power terminal, respectively, a reference terminal for receiving said source of reference voltage, and an output terminal connected to the output terminal of said first optical coupler, said second optical coupler producing said reference voltage at its output terminal during normal conductive operation of said second output transistor, and producing said second DC voltage at its output terminal, as said second fault signal, for either nonconduction of or a fault condition in the conductive operation of said second output transistor.

10. The protection circuit of claim 8, further including means connected at one terminal to the output terminal of said first optical coupler, and having another terminal for receiving said source of reference potential, for delaying the production of said first fault signal by said optical coupler, for a predetermined period of time after the magnitude of sensed current reduces to below said predetermined value, to substantially eliminate false triggering of said control logic means, either when the latter is operated to sequentially turn off said first output transistor, and turn on said second output transistor, whereby for a relatively short time period said first and second transistors are concurrently nonconductive, or by relatively short-lived transients causing sudden large increases in the value of $V_{ce}$ of said first output transistor, while conducting current.

11. The protection circuit of claim 9, further including means connected at one terminal to the output terminal of said second optical coupler, and having another terminal for receiving said source of reference potential, for delaying the production of said second fault signal by said second optical coupler for a predetermined period of time after the magnitude of the associated sensed current reduces to below said predetermined value, to substantially eliminate false triggering of said control logic means, either when the latter is operated to sequentially turn off said second output transistor and turn on said first output transistor, whereby for a relatively short time period said first and second transistors are concurrently nonconductive, or by relatively short-lived transients causing sudden large increases in the value of $V_{ce}$ of said second output transistor, while conducting current.

12. The protection circuit of claim 10, wherein said delay means includes:
   a resistor connected between said output terminal of said first optical coupler means and said second power terminal; and
   a capacitor having one terminal connected to the output terminal of said first optical coupler, and another terminal for receiving said source of reference potential, the product of the values of said resistor and capacitor being equal to a predetermined time constant for said delay means.

13. The protection circuit of claim 11, wherein said delay means includes:
   a resistor connected between said output terminal of said second optical coupler means and said second power terminal; and
   a capacitor having one terminal connected to the output terminal of said second optical coupler, and another terminal for receiving said source of reference potential, the product of the values of said resistor and capacitor being equal to a predetermined time constant for said delay means.

14. In a transistorized switching circuit including a first terminal for receiving a DC operating voltage, a second terminal for receiving a source of reference potential, an output terminal, first switching transistor means having a control electrode, and a main current conduction path connected between said first and output terminals, and second switching transistor means having a control electrode and a main current conduction path connected between said second and output terminals, a circuit for both operating an individual one of said protecting said first and second switching transistor means, comprising:
   sensing means connected between said first and second terminals, responsive individually to either of (1) the voltage drop $V_{ce1}$ across said main current conduction path of said first switching transistor means in a conductive state increasing to within a given percentage of a first DC reference voltage, concurrently with said second switching transistor means in a substantially nonconductive state, and (2) to the voltage drop $V_{ce2}$ across said main current conduction path of said second switching transistor means in a conductive state increasing to within a given percentage of a second DC reference voltage, concurrently with said first switching transistor means in a substantially nonconductive state; (3) $V_{ce1}$ and $V_{ce2}$ each being within a given percentage of said first and second DC reference voltages, respectively, with said first and second switching transistor means each being in a conductive state; and (4) $V_{ce1}$ and $V_{ce2}$ each being greater than said first and second DC reference voltages, respectively, for producing a fault signal indicative of a fault condition;
   control means responsive to said fault signal, for concurrently applying turnoff signals to the control electrodes of said first and second switching transistor means, respectively, for turning off the conducting one of said first and switching transistor means to provide a relatively high impedance for its respective main current path, said control means being responsive in the absence of said fault signal to a high-level input signal, for concurrently applying a turnon signal to the control terminal of said second switching transistor means, which responds by substantially reducing the impedance of its main current path, and a turnoff signal to the control terminal of said first switching transistor means, said control means being responsive in the absence of said fault signal to a low-level input signal, for concurrently applying a turnoff signal to the control terminal of said second switching transistor means and a turnon signal to the control terminal of said first switching transistor means, the latter responding by substantially reducing the impedance of its main current path.

15. The transistorized switching circuit of claim 14, wherein said sensing means includes a dual optical coupler means having a first input terminal connected to said output terminal, a second input terminal receptive of said first DC reference voltage, a third input terminal connected to said output terminal, a fourth input terminal connected to said second terminal of said switching circuit, and an output terminal, where said fault signal is produced.

16. The transistorized switching circuit of claim 15, further including delay means connected between said fourth input terminal of said dual optical coupler and said second terminal, and having a common terminal connected to the output terminal of said dual optical coupler means, for delaying the production of said fault signal at said output terminal of said dual optical coupler means for a predetermined period of time, thereby substantially eliminating false triggering of said control means to the fault condition.

17. The transistorized switching circuit of claim 16, wherein said delay means further includes:
   a timing resistor connected between said fourth input terminal and said common terminal; and
   a timing capacitor connected between said common terminal and said second terminal of said switching circuit.

18. The transistorized switching circuit of claim 14, wherein said sensing means includes:
   first through third impedance means connected in a series circuit, said first impedance means having one end connected to said first terminal, said third impedance means having one end connected to said second terminal, said first DC reference voltage being produced at the common connection of said first and second impedance means, said second DC reference voltage being produced at the common connection of said second and third impedance means;

first unidirectional current means connected between said output terminal and the common connection of said first and second impedance means, polarized for passing current therebetween whenever $V_{ce1}$ exceeds said first DC reference voltage by a predetermined differential;

second unidirectional current means connected between said output terminal and the common connection of said second and third impedance means, polarized for passing current therebetween whenever $V_{ce2}$ exceeds said second DC reference voltage by a predetermined differential; and current sensing means coupled individually to said first and second unidirectional current means, responsive to the concurrence of current flow through said first and second unidirectional current means having greater than a predetermined magnitude, respectively, for producing said fault signal.

19. The transistorized switching circuit of claim 18, wherein said first and second unidirectional current means each include a single light-emitting diode $LED_1$ and $LED_2$, respectively, the intensity of light emitted therefrom being directly proportional to the magnitude of current flow therethrough, and wherein said current sensing means includes:

a fault terminal;

a resistor connected between said fault terminal and the common connection of said second and third impedance means;

first photosensitive switching circuit means responsive to an intensity of light output from $LED_1$ above a predetermined value, for establishing a relatively low-impedance current conduction path between said fault and second terminals, and to such light intensity below said predetermined value for establishing a relatively high-impedance current conduction path between said fault and second terminals; and second photosensitive switching circuit means responsive to an intensity of light output from $LED_2$ above a predetermined value, for establishing a relatively low-impedance current conduction path between said fault and second terminals, and to such light intensity below said predetermined value for establishing a relatively high-impedance current conduction path between said fault and second terminals.

20. The transistorized switching circuit of claim 19, wherein said current sensing means further includes in combination with said resistor, timing means connected between said resistor and said second terminal, for prohibiting the production of the fault signal if the fault condition persists less than a predetermined time duration.

21. The transistorized switching circuit of claim 20, wherein said timing means is a capacitor, and the predetermined time duration a fault condition must persist before said timing means permits the production of said fault signal, is determined by the product of the values of said resistor and capacitor.

22. The transistorized switching circuit of claim 18, wherein said first and third impedance means each include a zener diode polarized for providing said first and second DC reference voltages each with a polarity the same as said operating voltage.

23. A method for protecting a switching transistor having base, collector, and emitter electrodes, from excessive power dissipation, comprises the steps of:

sensing the level of voltage between said collector and emitter electrodes;

producing a stable reference voltage greater than the saturation voltage of said transistor;

measuring the time duration that the level of sensed voltage exceeds the level of said stable reference voltage; and turning off said transistor whenever the time duration exceeds a predetermined period of time.

24. A circuit for protecting a switching transistor having base, collector, and emitter electrodes, from excessive power dissipation, comprising:

means for sensing the level of voltage between said collector and emitter electrodes;

means for producing a stable reference voltage greater than the saturation voltage of said transistor;

means for measuring the time duration that the level of sensed voltage exceeds the level of said stable reference voltage; and means for turning off said transistor whenever the time duration exceeds a predetermined period of time.

25. A circuit for protecting a switching transistor having base, collector, and emitter electrodes, from excessive power dissipation, comprising:

means for sensing the level of voltage between said collector and emitter electrodes;

means for producing a stable reference voltage having a level greater than that of the saturation voltage of said transistor; and means for turning off said transistor in response to the level of said sensed voltage approaching to within a predetermined differential of said stable reference voltage.

26. A protection circuit for protecting a switching transistor having base, collector, and emitter electrodes from excessive power dissipation, said base electrode being receptive of a turnon signal, comprising:

means for producing a stable reference voltage having a level greater than that of the saturation voltage of said transistor; and means responsive to the level of voltage between said collector and emitter electrodes approaching to within a predetermined differential of said stable reference voltage, for turning off said transistor from a conductive state.

27. The protection circuit of claim 26, wherein said stable reference voltage producing means includes:

a resistor; and a zener diode connected in series with said resistor between a source of operating voltage and a point of common potential, the stable reference voltage being developed at the common connection between said zener diode and said resistor.

28. The protection circuit of claim 26, wherein said turnoff means includes:

unidirectional current means connected between said collector electrode and said means for producing a stable reference voltage, for unidirectionally conducting current therebetween, whenever said transistor is turned on with the voltage between said collector and emitter electrodes being less than the level of said stable reference potential; and control means coupled to said unidirectional current means, and receptive of a turnon signal, responsive initially to the presence of said turnon signal, for applying a control signal to the base of said transistor for turning on the transistor into saturation, and thereafter responsive to the absence of current flow through said unidirectional current means for a predetermined period of time, for removing the control signal from the base, thereby turning off said transistor.

* * * * *